United States Patent [19]

Testa et al.

[11] Patent Number: 5,488,539
[45] Date of Patent: Jan. 30, 1996

[54] PROTECTING COT PACKAGED ICS DURING WAVE SOLDER OPERATIONS

[75] Inventors: James F. Testa, Mountain View; Jens Horstmann, Sunnyvale; Hassan Siahpolo, Campbell, all of Calif.

[73] Assignee: Sun Microsystems, Inc., Mountain View, Calif.

[21] Appl. No.: 184,015

[22] Filed: Jan. 21, 1994

[51] Int. Cl.⁶ ........................................ H05K 7/20
[52] U.S. Cl. .................. 361/720; 228/215; 228/222; 361/767; 361/807
[58] Field of Search .................. 228/180.1, 180.12, 228/214, 215, 222; 361/704, 707, 720, 760, 765–769, 771, 777, 807–812, 816; 257/712

[56] References Cited

U.S. PATENT DOCUMENTS

| | | | |
|---|---|---|---|
| 4,342,415 | 8/1982 | Wachs | 228/215 |
| 4,731,699 | 3/1988 | Nitta et al | 361/808 |
| 4,739,448 | 4/1988 | Rowe et al. | 361/707 |
| 4,761,881 | 8/1988 | Bora et al. | 361/760 |
| 4,922,324 | 5/1990 | Sudo | 257/712 |
| 4,970,624 | 11/1990 | Arneson et al | 361/808 |
| 5,102,712 | 4/1992 | Peirce et al. | 361/765 |
| 5,128,506 | 7/1992 | Dahne et al. | 228/180.1 |
| 5,176,349 | 1/1993 | Bendorf | 361/760 |
| 5,223,691 | 6/1993 | Frei et al. | 228/180.1 |
| 5,270,903 | 12/1993 | McMichen et al. | 361/760 |

FOREIGN PATENT DOCUMENTS 3077768  6/1987  Japan ................................. 361/704

*Primary Examiner*—Gregory D. Thompson
*Attorney, Agent, or Firm*—Hickman & Beyer

[57] ABSTRACT

A method and apparatus is disclosed for protecting a solder pad for a chip on tape packaged integrated circuit mounted on a surface of a printed circuit board that is exposed to a wave soldering operation. A pad cover may be used to protect the solder pad. The pad cover is mounted over the solder pad in a manner that protects the solder pad from being exposed to solder during the wave solder operation. After the wave solder is completed, the cover is removed and the leads of the chip on tape packaged integrated circuit are connected to associated solder pad traces on the printed circuit board. This type of arrangement is particularly useful in arrangements which require a heat sink to cool the chip on tape packaged integrated circuit.

11 Claims, 5 Drawing Sheets

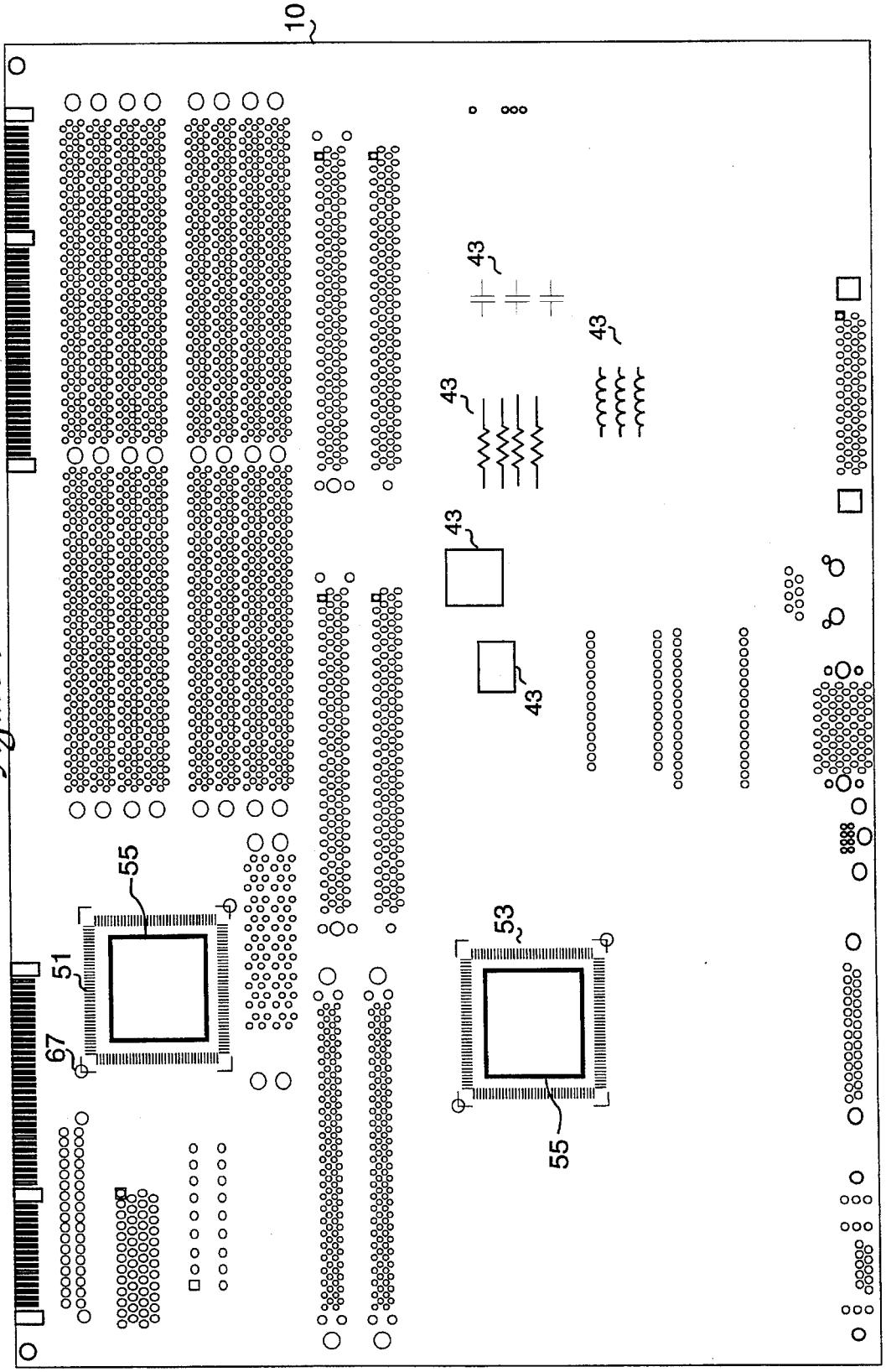

PROTECTING COT PACKAGED ICS DURING WAVE SOLDER OPERATIONS

BACKGROUND OF THE INVENTION

The present invention relates generally to a device and method for protecting printed circuit board solder pads that are used to support integrated circuits (ICs) packaged using chip-on-tape (COT) techniques. More particularly, a pad cover is disclosed which is used to protect the solder pad to which a chip-on-tape packaged IC will be attached before or after wave soldering operations.

During the assembly of computer boards such as motherboards, it is common to mount numerous components on a first surface of a printed circuit board (PCB). Often, many of the components include pins that extend through holes in the printed circuit board and are soldered thereto at the back surface of the PCB. At the same time, a number of surface mounted devices including capacitors, resistors, inductors and certain surface mounted integrated circuits may also be mounted on the back surface of the PCB. One cost effective approach to securing both the pins of the through mounted components mounted on the top surface and the pins/leads of the surface mounted components mounted on the bottom surface is known as a wave solder. During a wave solder operation, an assembled board is run through an oven over a molten solder fountain. The molten solder is exposed to the back surface of the board. The solder attaches to metallic components and solidifies to bond both the through mounted components from the top surface and the surface mounted components from the bottom surface to the printed circuit board.

In the ongoing efforts to provide increased computational power in smaller units, convention plastic encapsulation packaging of integrated circuits has sometimes given way to chip on tape (COT) packaging. Chip on tape packaging is also sometimes referred to as tab automated bonding (TAB). COT packaging has several superior electrical characteristics when compared to conventional plastic encapsulation packaging. Most notably, COT packaging has lower inductance, lower capacitance and no internal ground plane. Furthermore, COT packages are smaller, which provides shorter trace lengths, decreasing the inductance and COT packages can have more pins which allow for more ground pins which in turn allows the use of more powerful drivers. Since COT packages are much smaller than conventional packaging techniques and have the described advantages, there are some good incentives to utilizing such packaging in boards used in computer systems.

When a high powered integrated circuit (IC) is packaged in COT, there may be a need to provide a heat sink which helps dissipate excess heat generated by the IC. Applicants have found that a convenient way to couple a heat sink to a COT packaged IC is to mount the COT packaged IC on the bottom surface of the computer board while mounting a heat sink on the top surface directly opposite the COT packaged IC. A number of thermal vias are provided through the motherboard PCB between the COT packaged IC and the heat sink to insure that good cooling is obtained using an inexpensive, relatively uncomplicated structure. One reason to mount the IC on the bottom surface of the computer board (rather than the top) is that the heat sink typically has a relatively high profile and most computer mother boards have a relative low clearance on the bottom surface. One drawback of this design, however, is that having exposed COT packaged ICs or exposed COT solder pads on the bottom surface of the computer board would preclude the wave soldering operation described above.

Accordingly, it is an object of the present invention to provide a pad cover suitable for protecting solder pads for COT packaged ICs that are exposed to a wave soldering operation.

SUMMARY OF THE INVENTION

A pad cover is disclosed for protecting a solder pad for a chip on tape packaged integrated circuit that is mounted on the surface of a printed circuit board that is exposed to a wave soldering operation. The pad cover is mounted over the solder pad in a manner that protects the solder pad from being exposed to solder during the wave solder operation and from being melted. In one embodiment, the pad cover includes a pair of diagonally positioned anchor pins that extend through the printed circuit board to secure the pad cover to the printed circuit board. The anchor pins are arranged such that the pad cover can be readily removed after the wave solder operation has been conducted.

In another embodiment, a heat sink is provided for dissipating heat energy from the chip on tape packaged integrated circuit that is mounted on the protected solder pad. The heat sink is attached to the printed circuit board at a position substantially opposite the solder pad. A plurality of thermal vias that pass through the printed circuit board are provided between the solder pad and the heat sink for transferring heat energy from the solder pad to the heat sink to facilitate cooling of a chip on tape packaged integrated circuit during use.

In a method of assembling a computer board according to the present invention, a plurality of through mounted components are mounted on a first surface of a printed circuit board and a plurality of surface mounted components are mounted to a second surface of the printed circuit board. A solder pad for supporting a chip on tape packaged integrated circuit is also formed on the second surface of the printed circuit board. The second surface of the printed circuit board is then subjected to a wave solder in order to secure a plurality of the components to the printed circuit board. Prior to the wave solder, a pad cover is placed over the solder pad so that the wave soldering step is arranged to take place with both the solder pad and the pad cover in place. After the wave solder is completed, the pad cover is removed and the leads of the chip on tape packaged integrated circuit are connected to associated traces on the printed circuit board.

BRIEF DESCRIPTION OF THE DRAWINGS

The invention, together with further objects and advantages thereof, may best be understood by reference to the following description taken in conjunction with the accompanying drawings in which:

FIG. 7 is a bottom view of the computer motherboard shown in FIG. 1 with a pair of chip on tape packaged integrated circuits attached to a pair of solder pads.

DETAILED DESCRIPTION OF THE INVENTION

Figure 1:
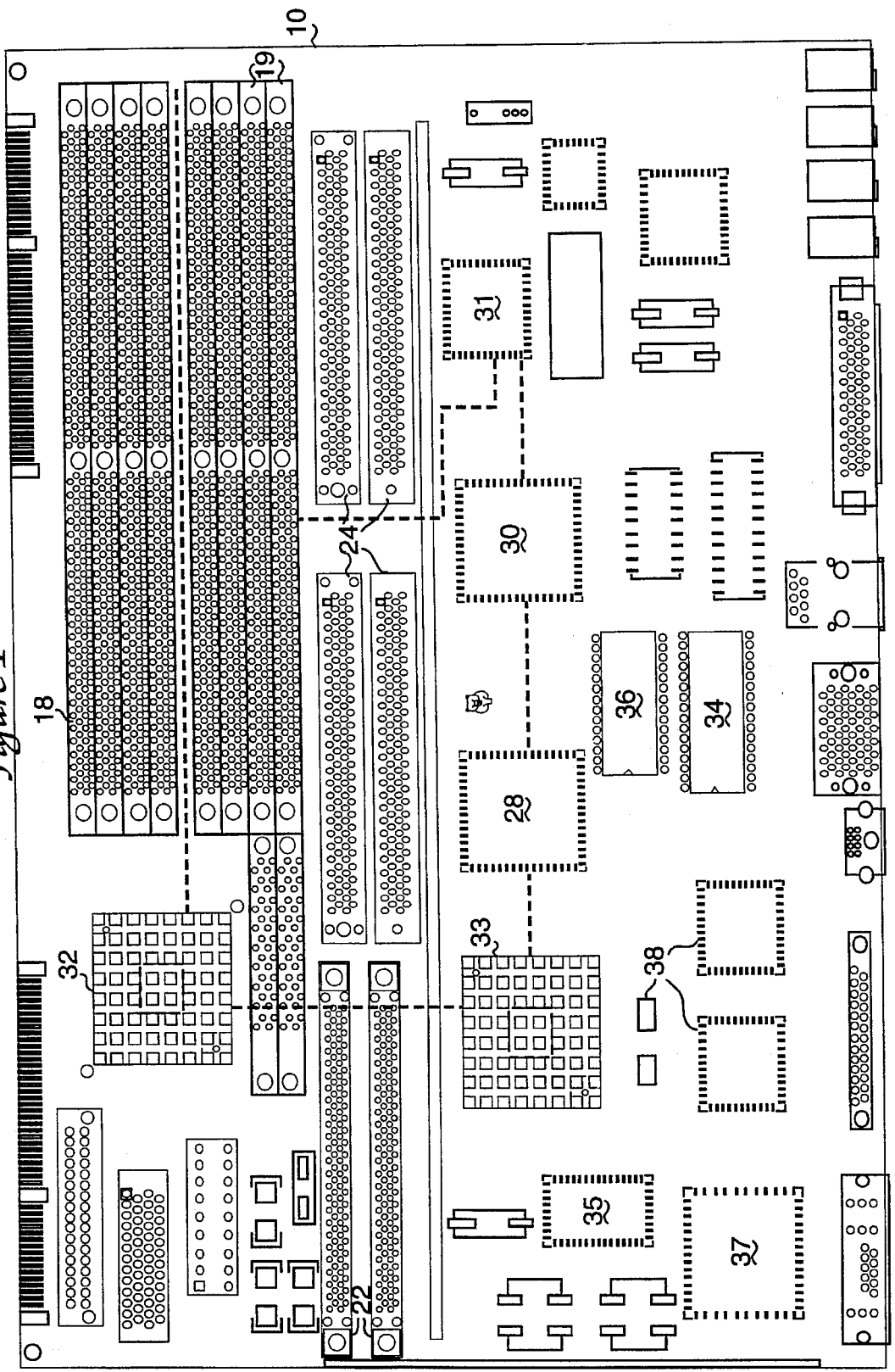
FIG. 1 is a top view of a computer motherboard formed in accordance with the present invention.
Figure 2:
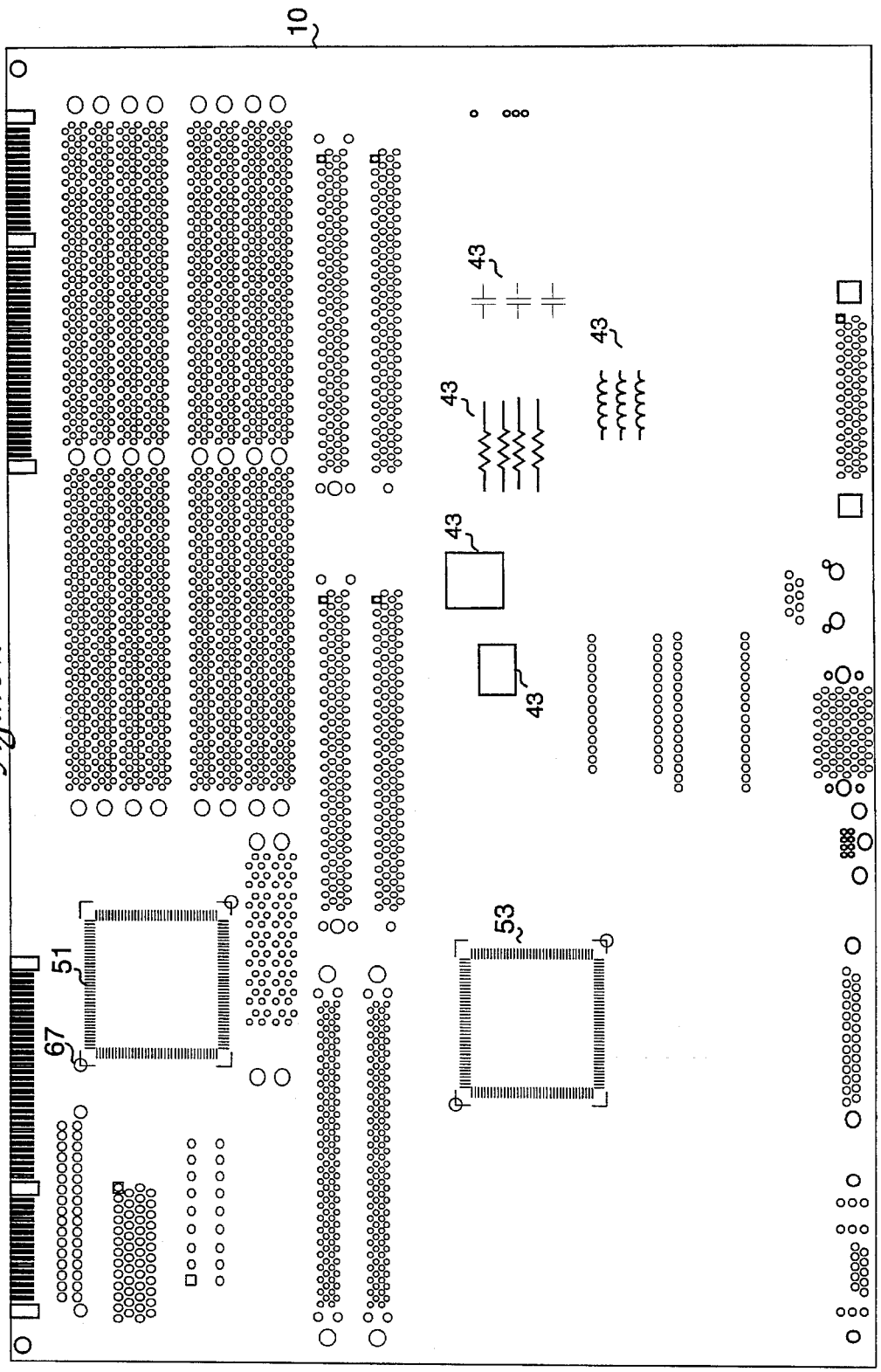
FIG. 2 is a bottom view of the computer motherboard shown in FIG. 1 with a pair of exposed COT landing patterns with a plurality solder pads formed on the bottom surface of the motherboard.

A typical circuit board for an electronic system has a plurality of components mounted on each face of the board. By way of example, FIGS. 1 and 2 show a computer motherboard 10 formed from printed circuit board (PCB). The motherboard carries a plurality of DRAM SIMM connectors 18, a pair of VRAM SIMM connectors 19, a pair of memory bus (M-Bus) connectors 22, a plurality of system bus (S-Bus) connectors 24, a S-Bus to External Bus Controller 28, a direct memory access controller 30, a ISDN interface controller 31 and a pair of heat sinks 32, 33 all mounted on a first surface of the board. This surface is normally considered the top surface of the motherboard since it has a number of high profile components. In addition to these components, the top surface may also include an EPROM chip 34, a clock chip 35, a time of day chip 36, a floppy controller 37 and a multiplicity of other through mounted chips 38. Some of these components are through hole mounted components that have pins that extend through the printed circuit board and are secured to the printed circuit board by soldering at the back surface.

A multiplicity of additional components are mounted on the back (second) surface of the motherboard as well. Typically, as seen in FIG. 2, these components include a multiplicity of surface mounted components 43 such as resistors, capacitors, inductors and surface mount ICs. Additionally, in boards formed in accordance with the present invention, at least one chip on tape packaged integrated circuit is mounted on the back side of the motherboard. In the embodiment shown in FIG. 2, a solder pad 51 for a memory graphics controller (not shown) and a solder pad 53 for an M-Bus to S-Bus interface chip (not shown) are formed on the back surface of the motherboard. The memory graphics controller and the M-Bus to S-Bus interface chip are each packaged using chip on tape technology.

A memory bus that is wired internally to the printed circuit board connects the memory graphics controller to the DRAM and VRAM SIMM connectors 18, 19. An M-bus connects the memory graphics controller to the M-Bus to S-Bus interface chip and to the M-bus connectors 22. Similarly, a system bus (S-Bus) that is wired internally to the printed circuit board connects the M-bus to S-bus interface chip to the External Bus Controller 28, the direct memory access controller 30, the ISDN interface controller 31, and a plurality of S-bus connectors 24.

Figure 3:
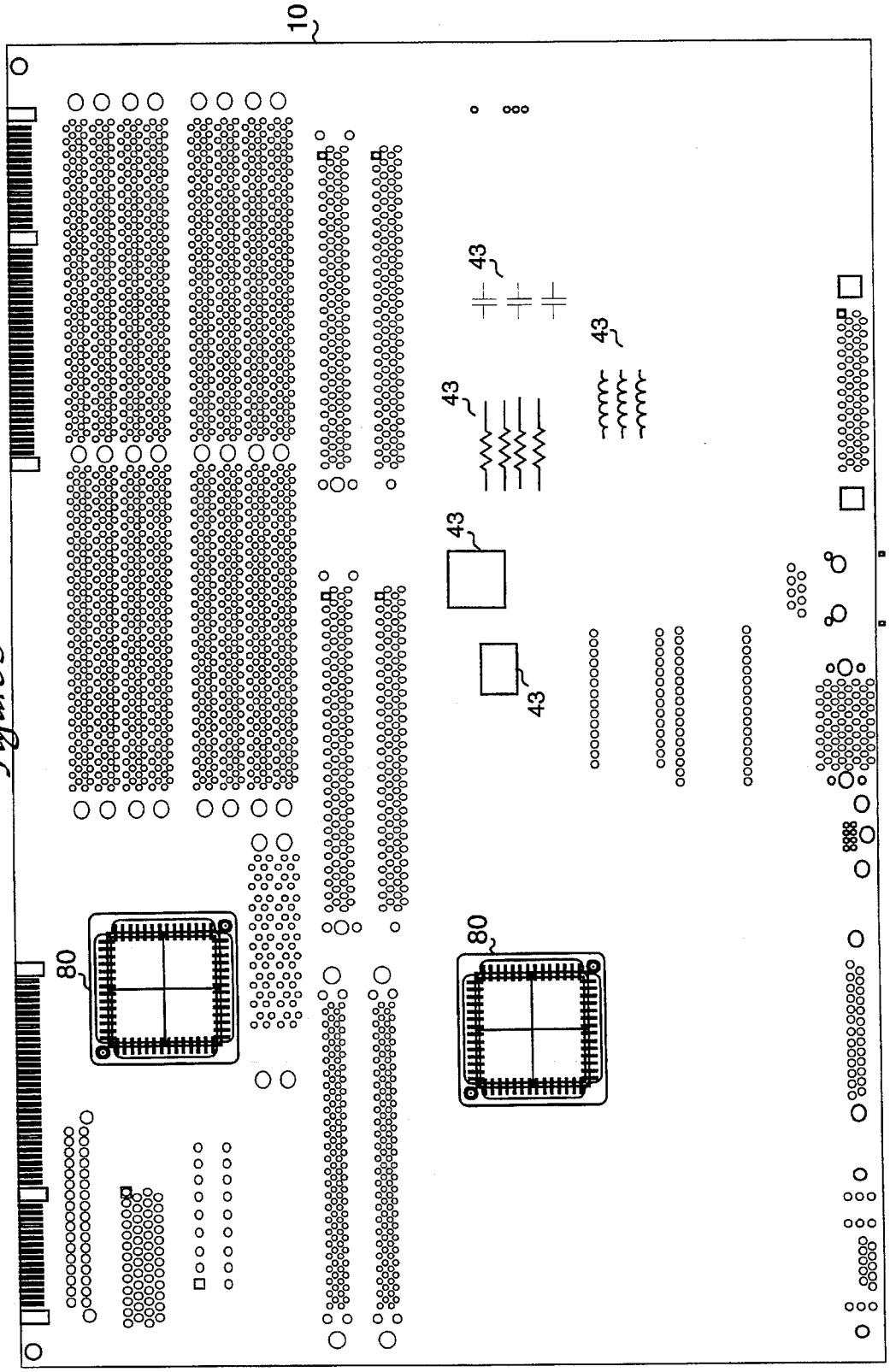
FIG. 3 is a bottom view of the computer motherboard shown in FIG. 1 with a pad cover in accordance with the present invention mounted thereon.

To assemble the motherboard, the through hole mounted components that reside on the first surface and the surface mounted components that reside on the second surface are mounted on the motherboard. Solder pads for the chip on tape packaged integrated circuits that are to be mounted on the back surface of the motherboard are also formed. The solder pads are plated onto the printed circuit board. Before the COT packaged ICs are attached, the motherboard is exposed to a wave solder operation. During the wave solder operation, the assembled board is run through an oven over a molten solder fountain. The molten solder is exposed to the back surface of the board. The solder attaches to metallic components and solidifies to bond both the through mounted components from the first (top) surface and the surface mounted components from the second (bottom) surface to the printed circuit board. It should be appreciated that the solder pads for the chip on tape packaged ICs can not be exposed to the wave solder operation since the solder would effectively short the contacts between the traces that are to be electrically connected to the COT packaged IC. Therefore, as seen in FIG. 3, pad covers 80 are placed over the solder pads during the wave solder operation to protect the solder pads.

Figure 4:
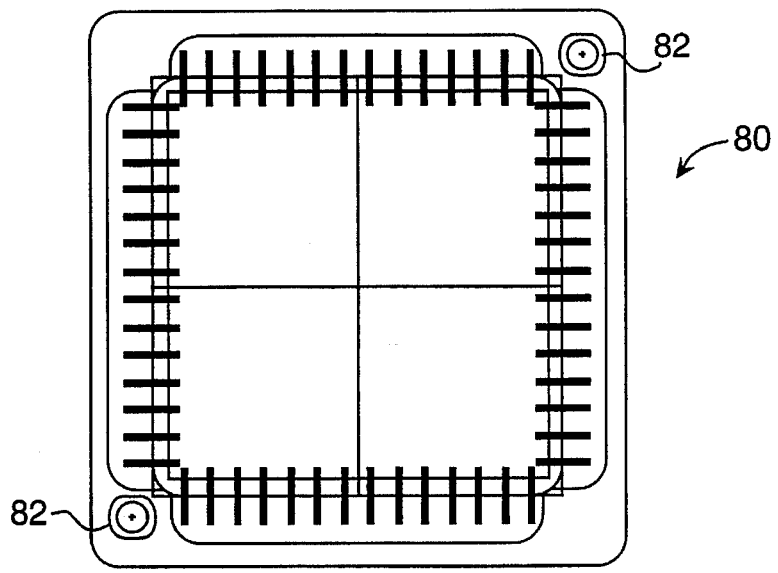
FIG. 4 is a top view of the wave solder pad cover shown in FIG. 3.
Figure 5:
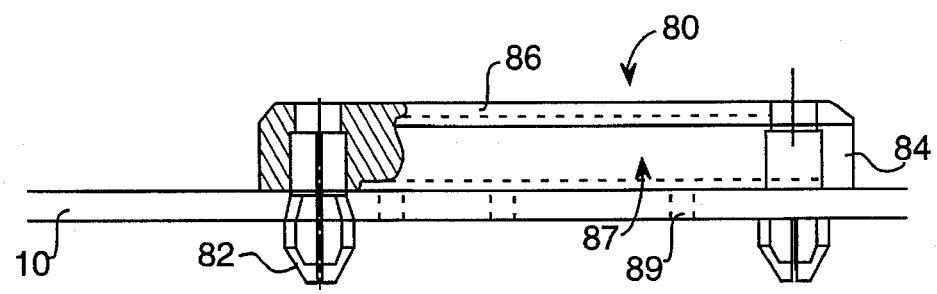
FIG. 5 is a partially cut away side view of the pad cover shown in FIG. 4

Referring next to FIGS. 4 and 5, a pad protector cover 80 in accordance with the present invention will be described. The pad cover 80 has a substantially square perimeter and includes anchor pins 82 at two diagonal corners. The pad cover 80 has four relatively low profile walls 84 and a top cover plate 86. In one embodiment, the walls 84 and cover plate 86 are integrally molded by a conventional technique such as injection molding. The four walls 84 cooperate to form a recess 87 that is suitable for encasing the solder pad when the pad cover is installed. Thermal vias 89 pass through the computer motherboard 10.

Figure 6:
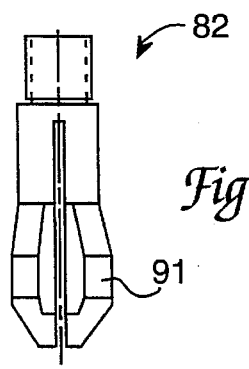
FIG. 6 is an enlarged side view of an anchor pin from the pad cover shown in FIGS. 4 and 5.

The anchor pins 82 each include a pair of facing split spring biased legs 91 that are rounded inward near their distal tip as best seen in FIGS. 5 and 6. When inserted into an anchor hole opening 67 on the motherboard 10 (best seen in FIG. 2), the tips of anchor legs 91 extend through the thickness of the printed circuit board 10 as best seen in FIG. 5. In this position, the legs 91 cooperated to snap the pad cover 80 into place such that the exposed edges of the walls 84 are relatively tightly drawn against the motherboard 10 to substantially close the recess 87. With the pad cover installed, the motherboard 10 may be run through a conventional wave solder operation.

Typically the wave solder is performed on the back surface of the motherboard to bond both the through mounted components from the first surface and the surface mounted components from the second surface to the motherboard. The pad cover then isolates the solder pad from the molten solder used during the wave soldering operation. The pad cover 80 is formed from a thermally insulative material. Accordingly, since the wave soldering operation is relatively short (i.e., typically no longer than a few minutes), the pad cover thermally protects the solder pad during the wave soldering operation as well. This is important since the solder pads consist of copper traces in the form of a landing pattern that is plated with a very thin layer of solder. The solder plating is typically very uniform in thickness and is on the order of just one mil thick. The uniform thickness is important since the lead contacts between the COT packaged IC and the traces in the landing pattern are extremely small and fine. Accordingly, it is important that the solder plating not melt during the wave soldering operation since this could ruin the later process of electrically connecting the COT to the printed circuit board.

After the wave soldering operation has been completed, the pad cover 80 is removed from the motherboard. Since the anchor legs are spring biases and rounded as seen in FIGS. 5 and 6, they may readily be manually popped out of the anchor holes 67. Thereafter, a conventional bonding process can be used to electrically connect the COT to traces on the printed circuit board. FIG. 7 shows a pair of COT's 55 attached to the traces. After bonding, a COT package cover (not shown) may be placed over the COT packaged IC to protect the IC from inadvertently being damaged during handling. The COT package cover(s) may be snapped into the same anchor hole openings 67 as the pad cover(s) 80.

Although only one embodiment of the present invention has been described in detail, it should be understood that the present invention may be embodied in many other specific forms without departing from the spirit or scope of the invention. Particularly, the invention has been described in connection with an embodiment that is applied to computer motherboards. However, it should be appreciated that the technique is equally applicable to other circuit boards that utilize chip on tape packaged ICs mounted on a surface that is to be exposed to a wave solder operation as well. Further, a substantially square pad cover geometry has been shown and described. However, other geometries can be used as well, provided that the pad cover adequately seal the region around the solder pad to prevent molten solder from contacting either the associated traces or solder pads. It is also important that the pad cover thermally protect the solder pad.

The invention has been described in the context of a method in which the COT packaged IC is connected to the solder pad after the wave soldering operation. However, in alternative embodiments, the COT packaged IC could be attached first. In such arrangements, the pad cover would need to cover the entire packaged IC. Therefore, the present examples are to be considered as illustrative and not restrictive, and the invention is not to be limited to the details given herein, but may be modified within the scope of the appended claims.

We claim:

1. An apparatus comprising:

a printed circuit board having a first surface, a second surface, and a plurality of through holes;

a solder pad for supporting a chip on tape packaged integrated circuit, the solder pad being formed on the first surface of the printed circuit board wherein said solder pad includes a multiplicity of fine metallic traces spaced closely together such that said traces are used to electrically connect said printed circuit board to said chip on tape packaged circuit;

a plurality of through hole mounted components which are mounted on the second surface of the printed circuit board and which include pins extending through said through holes such that a wave solder operation at the first surface of the printed circuit board secures said components to the printed circuit board; and a pad cover mounted over the solder pad in a manner that protects the solder pad from being exposed to solder during said wave solder operation thereby preventing damage to the metallic traces of the solder pad.

2. An apparatus as recited in claim 1 wherein the pad cover has a footprint geometry that is substantially the same as the solder pad that it protects and a recess adapted to receive the solder pad.

3. An apparatus as recited in claim 1 wherein the pad cover includes a pair of diagonally positioned anchor pins that extend through the printed circuit board to secure the pad cover to the printed circuit board thereby preventing solder from reaching the solder pad during a wave solder operation, the anchor pins being arranged such that the pad cover can be removed after said wave solder operation has been conducted.

4. An apparatus comprising:

a printed circuit board having a first surface, a second surface, and a plurality of through holes;

a solder pad for supporting a chip on tape packaged integrated circuit, the solder pad being formed on the first surface of the printed circuit board wherein said solder pad includes a multiplicity of fine metallic traces spaced closely together such that said traces are used to electrically connect said printed circuit board to said chip on tape packaged circuit;

a plurality of through hole mounted components which are mounted on the second surface of the printed circuit board and which include pins extending through said through holes such that a wave solder operation at the first surface of the printed circuit board secures said components to the printed circuit board; and a pad cover mounted over the solder pad in a manner that protects the solder pad from being exposed to solder during said wave solder operation thereby preventing damage to the metallic traces of the solder pad, the pad cover including a pair of diagonally positioned anchor pins that extend through the printed circuit board, the anchor pins having legs located at their distal end for engaging the second surface in order to firmly pull the pad cover into contact with the printed circuit board, the anchor pins being arranged such that the pad cover can be removed after said wave solder operation has been conducted.

5. An apparatus as recited in claim 3 further comprising:

a heat sink for dissipating heat energy, the heat sink being attached to the second surface of the printed circuit board at a position substantially opposite the solder pad; and a plurality of thermal vias passing through the printed circuit board between the solder pad and the heat sink for transferring heat energy from the solder pad to the heat sink to facilitate cooling of a chip on tape packaged integrated circuit mounted on the solder pad during use.

6. An apparatus as recited in claim 1 further comprising:

a heat sink for dissipating heat energy, the heat sink being attached to the second surface of the printed circuit board at a position substantially opposite the solder pad; and a plurality of thermal vias passing through the printed circuit board between the solder pad and the heat sink for transferring heat energy from the pad to the heat sink to facilitate cooling of a chip on tape packaged integrated circuit mounted on the solder pad during use.

7. An apparatus as recited in claim 1 further comprising:

a plurality of solder pads, each solder pad being arranged to support a chip on tape packaged integrated circuit, the solder pads being mounted on the first surface of the printed circuit board; and a plurality of pad covers, each pad cover being mounted over an associated solder pad in a manner that protects the associated solder pad from being exposed to solder during said wave solder operation.

8. A computer system comprising:

a printed circuit motherboard having first and second surfaces;

a plurality of components mounted on the second surface of said printed circuit motherboard, the components including a processor, memory bus connector and system bus connector;

a solder pad for supporting a chip on tape packaged integrated circuit, the solder pad being formed on the first surface of the printed circuit motherboard wherein said solder pad includes a multiplicity of fine metallic traces spaced closely together such that said traces are used to electrically connect said printed circuit motherboard to said chip on tape packaged circuit;

a chip on tape packaged integrated circuit having leads that can be electrically coupled to the traces;

wherein the motherboard is assembled by a process comprising the steps of securely mounting a pad cover over the solder pad so that the pad cover protects the metallic traces of the solder pad from damage during a wave solder operation;

wave soldering the first surface of the printed circuit board to secure a plurality of said components to the printed circuit board, the wave soldering step being arranged to take place with both the solder pad and the pad cover in place;

removing the pad cover; and mounting the chip on tape packaged integrated circuit on the solder pad and electrically connecting leads of the chip on tape packaged integrated circuit to associated traces on the printed circuit board.

9. A method of assembling a computer board, the method comprising the steps of:

forming a solder pad for a chip on tape packaged integrated circuit on a first surface of the printed circuit board, wherein said solder pad includes a multiplicity of fine metallic traces spaced closely together such that said traces are used to electrically connect said printed circuit board to said chip on tape packaged circuit;

securely mounting a pad cover over the solder pad so that the pad cover protects the metallic traces of the solder pad from damage during a wave solder operation;

arranging a plurality of components on a second surface of the printed circuit board;

wave soldering the first surface of the printed circuit board to secure a plurality of said components to the printed circuit board, the wave soldering step being arranged to take place with both the solder pad and the pad cover in place;

removing the pad cover; and mounting said chip on tape packaged integrated circuit on the solder pad and electrically connecting leads of the chip on tape packaged integrated circuit mounted on the solder pad to associated traces on the printed circuit board.

10. A method as recited in claim 9 further comprising the step of covering the electrically connected chip on tape packaged integrated circuit with a package cover to prevent damage to the integrated circuit during handling.

11. A method as recited in claim 9 wherein the printed circuit board includes a plurality of thermal vias extending between the solder pad and the second surface of the printed circuit board, the method further comprising the step of attaching a heat sink to the second surface of the printed circuit board such that the heat sink is in good thermal contact with the thermal vias.

\* \* \* \* \*